United States Patent
Kwon et al.

(10) Patent No.: US 11,181,955 B2
(45) Date of Patent: Nov. 23, 2021

(54) ELECTRONIC DEVICE HAVING THERMAL DIFFUSION STRUCTURE

(71) Applicant: Samsung Electronics Co., Ltd., Gyeonggi-do (KR)

(72) Inventors: Ohhyuck Kwon, Gyeonggi-do (KR); Jaeyoung Huh, Gyeonggi-do (KR); Daesuk Kang, Gyeonggi-do (KR); Seunghoon Kang, Gyeonggi-do (KR); Boram Kim, Gyeonggi-do (KR); Hongki Moon, Gyeonggi-do (KR); Yoonsun Park, Gyeonggi-do (KR); Kyungwoo Lee, Gyeonggi-do (KR); Seungjoo Lee, Gyeonggi-do (KR); Jonghoon Lim, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/774,618

(22) Filed: Jan. 28, 2020

(65) Prior Publication Data
US 2020/0241610 A1     Jul. 30, 2020

(30) Foreign Application Priority Data
Jan. 28, 2019   (KR) .......................... 10-2019-0010505

(51) Int. Cl.
*G06F 1/20* (2006.01)
*G06F 1/16* (2006.01)
*H01L 23/427* (2006.01)

(52) U.S. Cl.
CPC ............ *G06F 1/203* (2013.01); *G06F 1/1637* (2013.01); *G06F 1/206* (2013.01); *H01L 23/427* (2013.01)

(58) Field of Classification Search
CPC ...................................................... G06F 1/203
See application file for complete search history.

(56) References Cited

U.S. PATENT DOCUMENTS

| 8,897,002 B2* | 11/2014 | Degner | ................. G06F 1/1616 |
| | | | 361/679.37 |
| 9,832,292 B2* | 11/2017 | Moon | ...................... H01Q 9/42 |

(Continued)

FOREIGN PATENT DOCUMENTS

| EP | 3419398 | 12/2018 |
| JP | 2014-029920 | 2/2014 |

(Continued)

OTHER PUBLICATIONS

International Search Report dated May 21, 2020 issued in counterpart application No. PCT/KR2020/001294, 9 pages.

*Primary Examiner* — Robert J Hoffberg
(74) *Attorney, Agent, or Firm* — The Farrell Law Firm, P.C.

(57) ABSTRACT

Disclosed is an electronic device having a thermal diffusion structure and including a housing comprising a first surface, a second surface facing the first surface, and a third surface vertical to the first surface and the second surface, a display exposed through at least part of the first surface, a battery arranged between the first surface and the second surface, a heating source arranged between the battery and the third surface in a direction vertical to the first surface and the second surface, and a first thermal diffusion member arranged vertically to the first surface and the second surface, the first thermal diffusion member including a first portion in thermal contact with at least part of the heating source and diffusing heat provided by the heating source to at least one second portion.

6 Claims, 13 Drawing Sheets

(56) References Cited

U.S. PATENT DOCUMENTS

| | | | |
|---|---|---|---|
| 10,228,720 B2 * | 3/2019 | Degner | G06F 1/1658 |
| 10,320,051 B2 * | 6/2019 | Chiu | H05K 7/20336 |
| 10,389,007 B1 * | 8/2019 | Choi | H04B 1/3833 |
| 10,403,966 B2 * | 9/2019 | Su | G06F 1/1626 |
| 10,721,837 B2 * | 7/2020 | Lee | H05K 7/20336 |
| 10,798,849 B2 * | 10/2020 | Lee | H05K 7/2039 |
| 10,959,350 B2 * | 3/2021 | Lee | G06F 1/1635 |
| 2019/0006731 A1 * | 1/2019 | Chiu | G06F 1/20 |

FOREIGN PATENT DOCUMENTS

| | | | |
|---|---|---|---|
| JP | 2014-224952 | 12/2014 | |
| JP | 2016-045399 | 4/2016 | |
| JP | 2017-162983 | 9/2017 | |
| KR | 1020170097541 | 8/2017 | |
| KR | 1020180094831 | 8/2018 | |
| WO | WO-2018092949 A1 * | 5/2018 | G06F 1/1635 |

* cited by examiner

ELECTRONIC DEVICE HAVING THERMAL DIFFUSION STRUCTURE

CROSS-REFERENCE TO RELATED APPLICATION(S)

This application is based on and claims priority under 35 U.S.C. § 119 to Korean Patent Application No. 10-2019-0010505, filed on Jan. 28, 2019, in the Korean Intellectual Property Office, the disclosure of which is incorporated herein by reference in its entirety.

BACKGROUND

1. Field

The disclosure relates generally to an electronic device, and more particularly, to an electronic device having a thermal diffusion structure.

2. Description of Related Art

Electronic devices, such as mobile terminals, smart phones, or wearable devices, can provide various functions including a basic voice communication function and other functions such as a short-range wireless communication (e.g., Bluetooth® (BT), wireless fidelity (Wi-Fi), near field communication (NFC), mobile communication (e.g., third generation (3G), fourth generation (4G), and fifth generation (5G) functions, music or video play, photographing, and a navigation functions.

Recent electronic devices can support high-speed data communication (e.g., millimeter wave communication). Such electronic devices can separately include an antenna module for high-speed data communication.

However, the conventional antenna module for high-speed data communication generates excess heat at operation.

In addition, the antenna module supporting high-speed communication can be mounted on a side surface of an electronic device, rendering it difficult to secure a space for applying a heat emission structure to the side surface of the electronic device, which tends to be minimal. For example, when the conventional heat emission structure is applied, a problem arises in having to change a design of the electronic device in order to secure an additional space for the heat emission structure.

Accordingly, there is a need in the art for a method for decreasing the heat generated by the antenna module, as well as an improved structure for antenna heat emission.

SUMMARY

Aspects of the present disclosure are to address at least the above-mentioned problems and/or disadvantages and to provide at least the advantages described below. Accordingly, an aspect of the present disclosure is to provide a thermal diffusion structure (or heat emission structure) that minimizes a mounting space.

Another aspect of the present disclosure is to provide a heat emission structure that effectively diffuses and emits heat.

In accordance with an aspect of the disclosure, an electronic device includes a housing including a first surface, a second surface facing the first surface, and a third surface vertical to the first surface and the second surface, a display exposed through at least part of the first surface, a battery arranged between the first surface and the second surface, a heating source arranged between the battery and the third surface in a direction vertical to the first surface and the second surface, and a first thermal diffusion member arranged vertically to the first surface and the second surface, the first thermal diffusion member including a first portion in thermal contact with at least part of the heating source and diffusing heat provided by the heating source to at least one second portion.

In accordance with another aspect of the disclosure, an electronic device includes a housing, a display exposed through at least part of a front surface of the housing, a battery arranged within the housing, an antenna module arranged vertically to the display between the battery and a side surface of the housing, and supporting communication at a frequency band of at least 20 gigahertz (GHz), a conductor plate thermally contacting at least part of an inner side surface of the antenna module at a first end of the conductor plate, and a heat pipe contacting the first end of the conductor plate at a first end of the heat pipe, and arranged vertically to the display.

In accordance with another aspect of the disclosure, an electronic device includes a housing, a display exposed through at least part of a front surface of the housing, a battery arranged within the housing, an antenna module arranged vertically to the display between the battery and a side surface of the housing, and supporting communication at a frequency band of at least 20 GHz, and a heat pipe thermally contacting at least part of an inner side surface of the antenna module at a first portion of the heat pipe and arranged vertically to the display.

BRIEF DESCRIPTION OF THE DRAWINGS

The above and other aspects, features and advantages of certain embodiments of the disclosure will be more apparent from the following detailed description, taken in conjunction with the accompanying drawings, in which.

DETAILED DESCRIPTION

Figure 1:
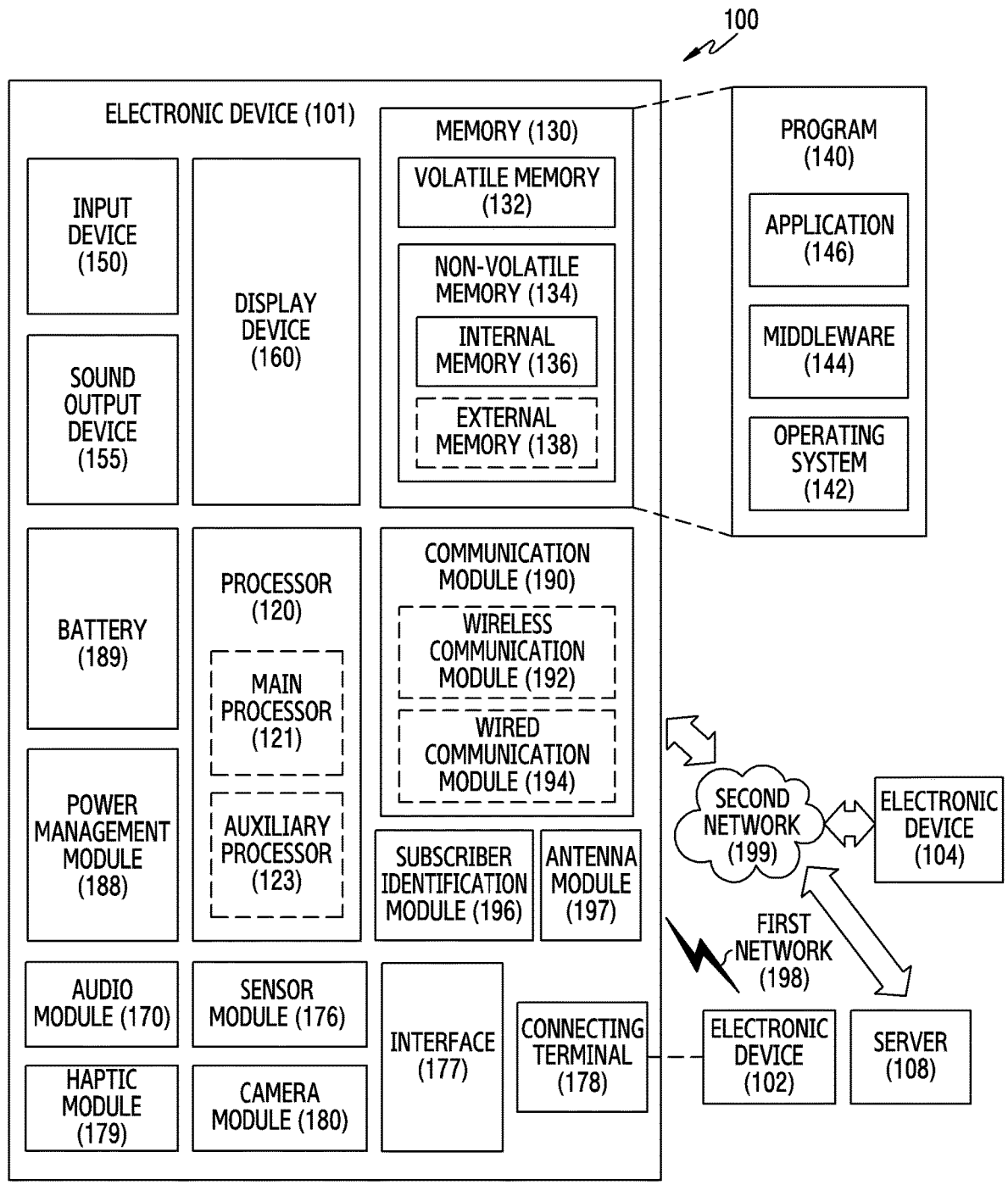
FIG. 1 is a block diagram of an electronic device within a network environment according to an embodiment.

Embodiments of the disclosure are described below with reference the accompanying drawings. In the disclosure, embodiments are described in the drawings and a related detailed description is set forth, but this is not intended to limit the embodiments of the disclosure. Descriptions of well-known functions and constructions are omitted for the sake of clarity and conciseness.

FIG. 1 is a block diagram illustrating an electronic device 101 in a network environment 100 according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) card 196, and an antenna module 197. At least one (e.g., the display device 160 or the camera module 180) of the components may be omitted from the electronic device 101, or one or more other components may be added in the electronic device 101. Some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute software (e.g., a program 140) to control at least one other component (e.g., a hardware or software component of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store data used by at least one component (e.g., the processor 120 or the sensor module 176) of the electronic device 101, which data may include software (e.g., the program 140) and input data or output data for a command related to the program 140. The memory 130 may include the volatile memory 132 or the non-volatile memory 134.

The program 140 may be stored in the memory 130 as software and may include an operating system (OS) 142, middleware 144, and/or an application 146.

The input device 150 may receive a command or data to be used by other component (e.g., the processor 120) of the electronic device 101, from the outside (e.g., a user) of the electronic device 101. The input device 150 may include a microphone, a mouse, a keyboard, or a digital pen (e.g., a stylus pen).

The sound output device 155 may output sound signals to the outside of the electronic device 101. The sound output device 155 may include a speaker or a receiver. The speaker may be used for general purposes, such as playing multimedia or playing record, and the receiver may be used for an incoming call. The receiver may be implemented as separate from, or as part of the speaker.

The display device 160 may visually provide information to the outside (e.g., a user) of the electronic device 101. The display device 160 may include a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). The connecting terminal 178 may include a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include a motor, a piezoelectric element, or an electric stimulator.

The camera module 180 may capture a still image or moving images. The camera module 180 may include one or more lenses, image sensors, ISPs, or flashes.

The power management module 188 may manage power supplied to the electronic device 101. The power management module 188 may be implemented as at least part of a power management integrated circuit (PMIC).

The battery 189 may supply power to at least one component of the electronic device 101. The battery 189 may include a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM card 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a printed circuit board (PCB)). The antenna module 197 may include a plurality of antennas. In such a case, at least one antenna appropriate for a communication scheme used in the communication network, such as the first network 198 or the second network 199, may be selected by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 performs a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform at least part of the function or the service requested, or an additional function or an additional service related to the request, and transfer an outcome to the electronic device 101. The electronic device 101 may provide the outcome, with or without further processing of the outcome, as at least part of a reply to the request. To that end, a cloud, distributed, or client-server computing technology may be used, for example.

Figure 2A:
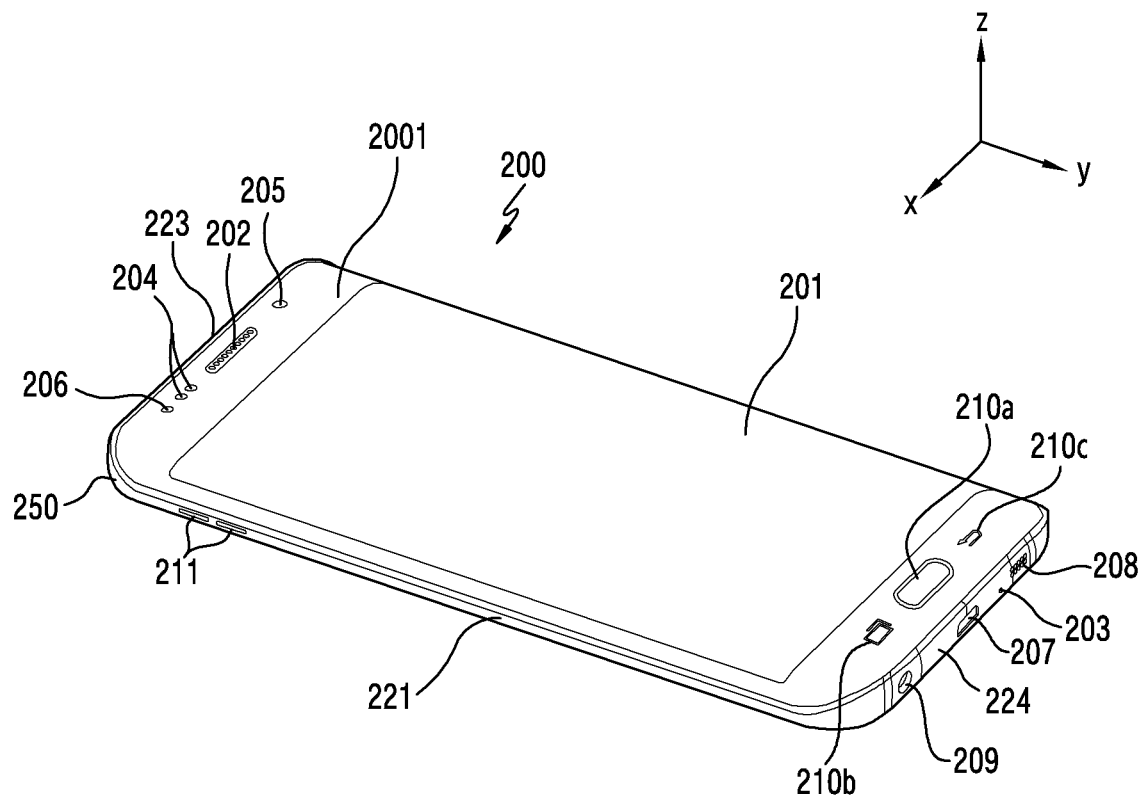
FIG. 2A illustrates a front surface of an electronic device according to an embodiment.
Figure 2B:
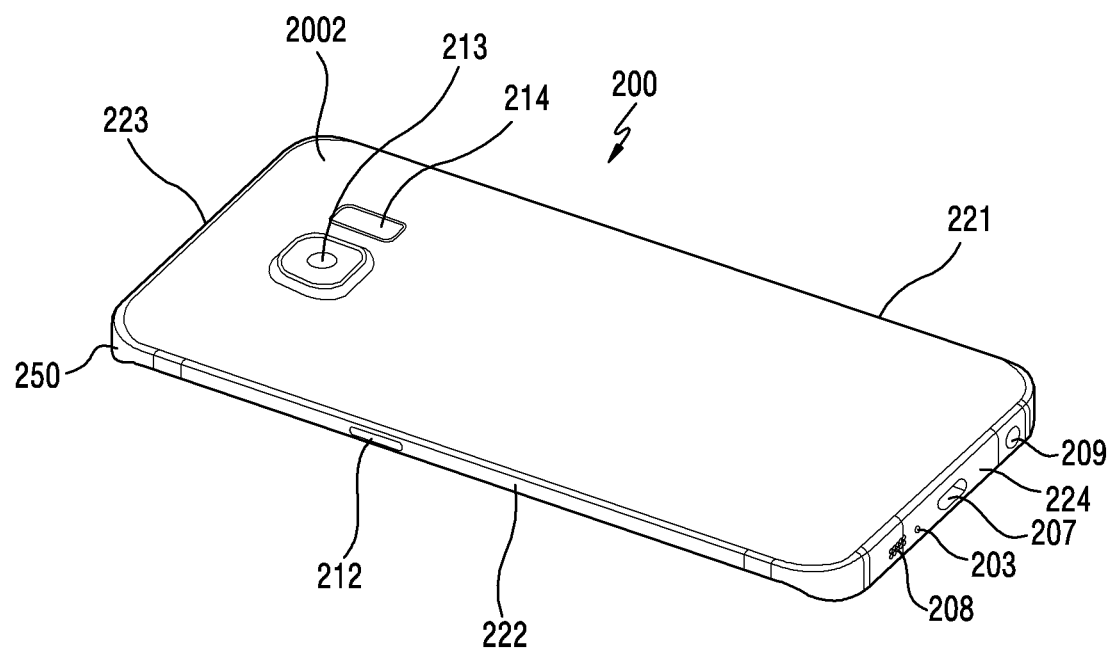
FIG. 2B illustrates a rear surface of an electronic device according to an embodiment.

FIG. 2A illustrates a front surface of an electronic device according to an embodiment. FIG. 2B illustrates a rear surface of the electronic device according to an embodiment.

Referring to FIG. 2A and FIG. 2B, the electronic device 200 (e.g., the electronic device 101) of embodiments may arrange a display 201 (e.g., the display device 160) in a front surface (i.e., a first surface) 2001 of a housing 250. A receiver 202 for outputting a voice of a counterpart may be arranged above the display 201. A microphone 203 for acquiring (or collecting) a voice of a user of the electronic device 2000 for the counterpart may be arranged below the display 201.

The electronic device 200 may arrange components for performing various functions of the electronic device 200, around a position where the receiver 202 is installed. The components may include at least one sensor module 204. This sensor module 204 may include at least one of an illuminance sensor (e.g., an optical sensor), a proximity sensor, an infrared sensor, and/or an ultrasonic sensor. The components may include a front camera 205, and an indicator 206 (e.g., a light emitting diode (LED)) for indicating state information of the electronic device 200 for a user.

The display 201 may be formed as a large screen wherein the display 201 occupies a majority of the front surface 2001 of the electronic device 200. A home key 210a, a menu key 210b, and a rearward key 210c may be formed below the display 201.

The electronic device 200 may arrange various electronic components at a lower side surface 224. For example, a microphone 203, a speaker hole 208, an interface 207, and an ear jack hole 209 may be arranged at the lower side surface 224. However, an embodiment is not limited to this, and at least one of the above-described electronic components may be arranged at a left side surface 221 of the housing 250, a right side surface 222 thereof, or an upper side surface 223 thereof as well.

The electronic device 200 may arrange at least one first side key 211 at the left side surface 221. The at least one first side key 211 may be formed as a pair and may be arranged at the left side surface 221 wherein a portion of the first side key 211 protrudes, and may perform a volume up/down function, a scroll function, for example.

The electronic device 200 may arrange at least one second side key 212 at the right side surface 222. The second side key 212 may perform a power on/off function, a wake-up and/or sleep function of the electronic device 200, for example.

The electronic device 200 may arrange a rear camera 213 in the rear surface (i.e., a second surface) 2002 facing the front surface, and may arrange at least one electronic component 214 around the rear camera 213. For example, the electronic component 214 may include at least one of an illuminance sensor (e.g., an optical sensor), a proximity sensor, an infrared sensor, an ultrasonic sensor, a heart rate sensor, a flash device or a fingerprint scan sensor.

The electronic device 200 may arrange a heating source in at least one of the left side surface 221 and the right side surface 222. The heating source may be an antenna module for high-speed communication of a frequency band of approximately 20 GHz or more (e.g., mm wave communication). The antenna module may be arranged between a battery (e.g., the battery 189 (not shown)) and a side surface (i.e., the right side surface or the left side surface) of the electronic device 200, vertically (e.g., a Z-axis direction) to the front surface 2001 and the rear surface 2002 of the electronic device 200.

The electronic device 200 may include a thermal diffusion member for diffusing heat provided by the heating source to outside the electronic device. A heat emission structure including the thermal diffusion member is described later with reference to FIG. 3A to FIG. 5B. The description is made below assuming that the heating source is the antenna module, for description convenience's sake.

Figure 3A:
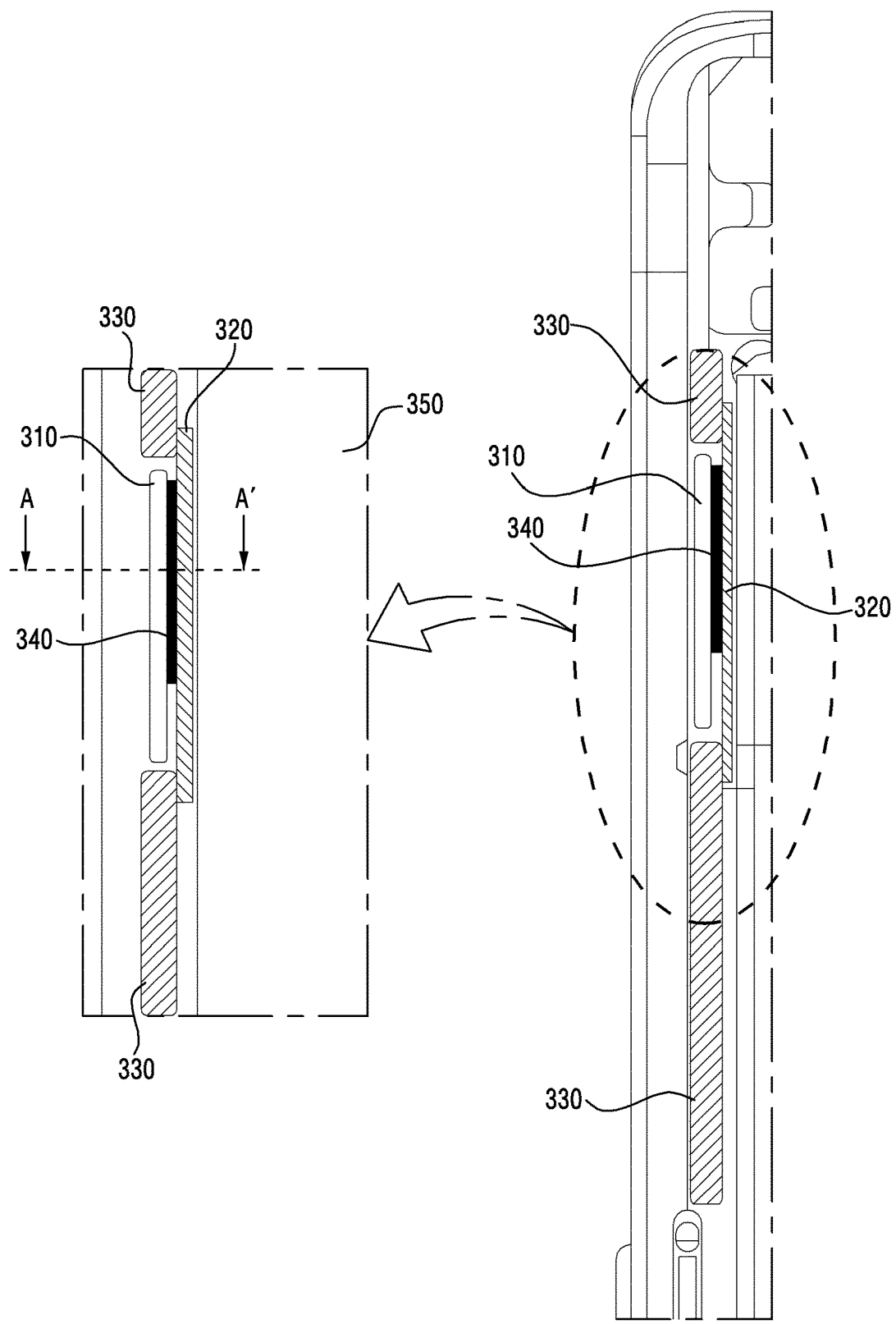
FIG. 3A illustrates a heat emission structure of an electronic device according to an embodiment.
Figure 3B:
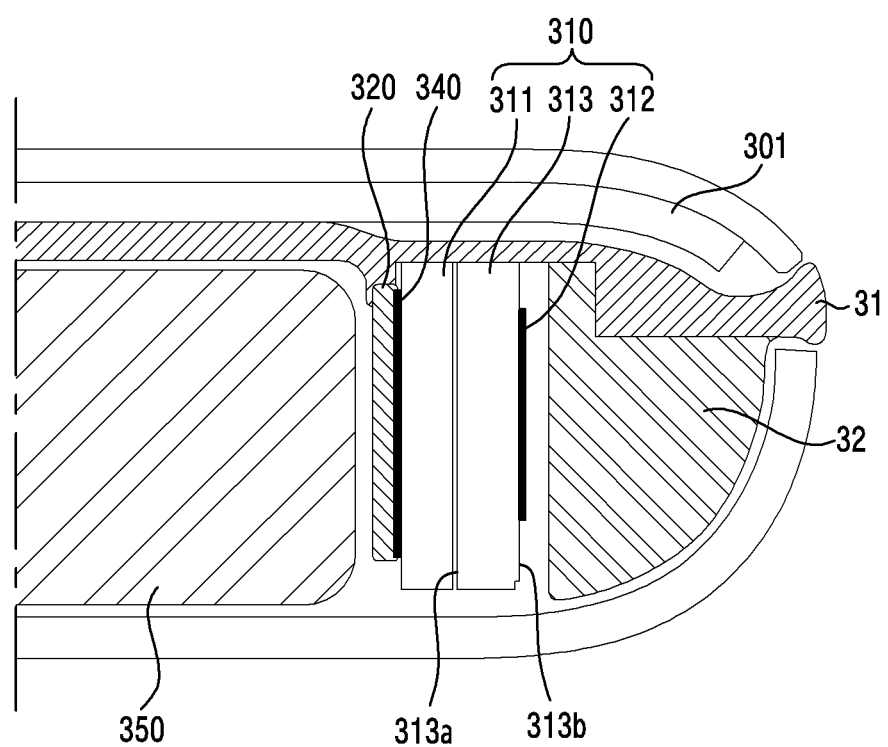
FIG. 3B is a cross section taken along line A-A' of FIG. 3A.
Figure 3C:
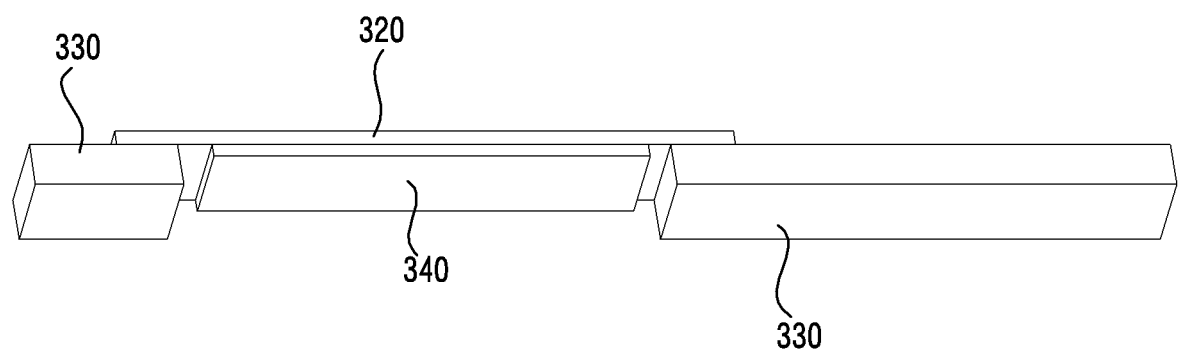
FIG. 3C illustrates a thermal diffusion member according to an embodiment.
Figure 3D:
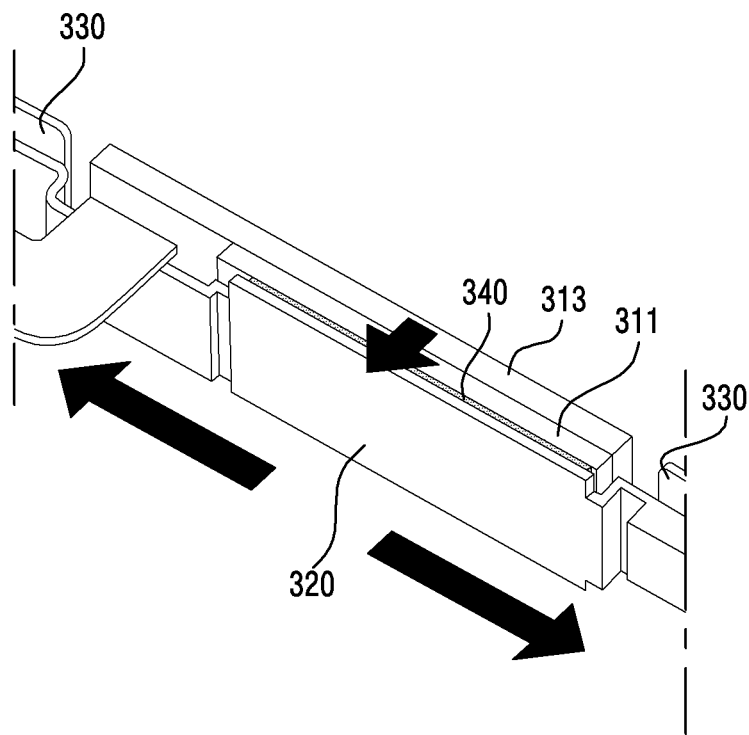
FIG. 3D illustrates a path of diffusing heat provided by an antenna module according to an embodiment.

FIG. 3A illustrates a heat emission structure of an electronic device according to an embodiment. FIG. 3B is a cross section taken along line A-A' of FIG. 3A. FIG. 3C illustrates a thermal diffusion member according to an embodiment. FIG. 3D illustrates a path of diffusing heat provided by an antenna module according to an embodiment.

Referring to FIG. 3A to FIG. 3D, the electronic device (e.g., the electronic device 101 or the electronic device 200) of an embodiment of the disclosure may include a display 301, a bracket 31, a side housing 32, an antenna module 310, a conductor plate 320, a heat pipe 330, thermal interfacing materials 340, and a battery 350.

The display 301 may be exposed through at least part of a front surface of the electronic device, and may be supported by the bracket 31. At least part of the bracket 31 may be formed of metal. Part of the bracket 31 may be coupled or combined to the side housing 32, which may be formed of an injection product (e.g., plastic).

The battery 350 may be arranged within the electronic device (e.g., between the front surface and rear surface of the electronic device). The antenna module 310 may be positioned between the battery 350 and the side housing 32. The antenna module 310 may be arranged vertically to the front surface and rear surface of the electronic device.

The antenna module 310 may include at least one communication module 311 processing a high-speed wireless signal, a substrate 313 in which the at least one communication module 311 is mounted, and an antenna pattern 312. The communication module 311 may be arranged in an inner side surface 313*a* of the substrate 313, and the antenna pattern 312 may be arranged in an outer side surface 313*b* of the substrate 313. The communication module 311 may further include a member for shielding an electromagnetic wave provided by a communication circuit, and an external interference signal. For example, a conductive shield can or a conductively coated injection member may surround at least part of the communication module 311.

At least the communication module 311 of an inner side surface of the antenna module 310 may thermally contact the conductor plate 320. For example, the inner side surface of the antenna module 310 and the conductor plate 320 may contact each other by thermal interfacing materials (TIMs) 340 (i.e., first thermal interfacing materials). The TIMs 340 may be a single layer or a multi-layer and may have a thermal conductivity. For example, the TIMs 340 may have a thermal conductivity of approximately 1 W/mk or more (e.g., approximately 4 W/mk). Also, the TIMs 340 may or may not have electrical conductivity. For example, when the TIMs 340 have the electrical conductivity, the TIMs 340 may shield electrical noise or an electro-magnetic interference (EMI). The TIMs 340 may also have excellent abrasion resistance or heat resistance and may include thermoplastic materials.

The TIMs 340 may include phase change materials (PCMs) that may change from a solid phase to a liquid phase by heat. The phase change materials of the liquid phase may have viscosity and may be compressive or non-compressive. The TIMs 340 may include materials having at least one physical property that is changed by heat. For example, the thermal interfacing materials may have a high viscosity by virtue of the heat.

The TIMs 340 may be molded in a scheme of surface-processing thermal conductive materials (e.g., silicon, silicone polymer, graphite, acrylic, etc.).

The conductor plate 320 may collect and diffuse heat provided from the antenna module 310, and may be formed of high thermal conductivity materials, such as copper.

The conductor plate 320 may have a specific shape (e.g., a rectangular shape), and may contact an upper surface (e.g., the communication module 311) of the antenna module 310 through the TIMs 340. As illustrated in FIG. 3C, the conductor plate 320 may be adhered to the TIMs 340 near the center of the conductor plate 320 and be connected with the heat pipe 330 at both sides of the conductor plate 320. This is merely an example, and the conductor plate 320 may be connected with the heat pipe 330 at only one side of the conductor plate 320. The conductor plate 320 may contact the heat pipe 330 by means of second thermal interfacing materials or welding.

The heat pipe 330 may be a thermal interfacing member capable of transferring a large amount of heat to a relatively low-temperature region by using a fluid of a high specific heat. For example, the heat pipe 330 may control transferring heat provided from the antenna module 310 to the relatively low-temperature region, diffusing a heat transfer path to a region around the heat pipe 330, and dispersing the heat to a region away from the region around the heat pipe 330. This heat pipe 330 has a known construction, and thus, a detailed description thereof is omitted.

The heat pipe 330 may be a heat transfer path, a heat transfer diffusion path, or a heat dispersion path. The heat pipe 330 may be constructed in various shapes, may have one end in contact with the conductor plate 320, and may have an opposing end arranged in a low-temperature region. The heat pipe 330 may be constructed in a shape of a flat section so as to maximize an adhesive surface of the conductor plate 320.

As illustrated in FIG. 3D, heat provided by the communication module 311 mounted in the substrate 313 may be transferred to the conductor plate 320 via the thermal interfacing materials 340, and be moved and/or diffused into a low-temperature region via the heat pipe 330 connected with the conductor plate 320.

The thermal diffusion member (e.g., the conductor plate 320 and the heat pipe 330) may contact the bracket 31 of metal materials. Through this, the heat provided by the antenna module 310 may be diffused via the bracket 31 of metal materials.

As the antenna module 310, the conductor plate 320, and the heat pipe 330 are arranged in a vertical direction not a horizontal direction with respect to the front surface and rear surface of the electronic device 200, the above-described embodiment may minimize a transverse (e.g., X axis) size of a mounting space for mounting a heat emission structure. In turn, the electronic device 200 may secure a mounting space (e.g., transverse length) of the battery 350, and/or may prevent an increase of a transverse size of the electronic device 200.

Figure 4A:
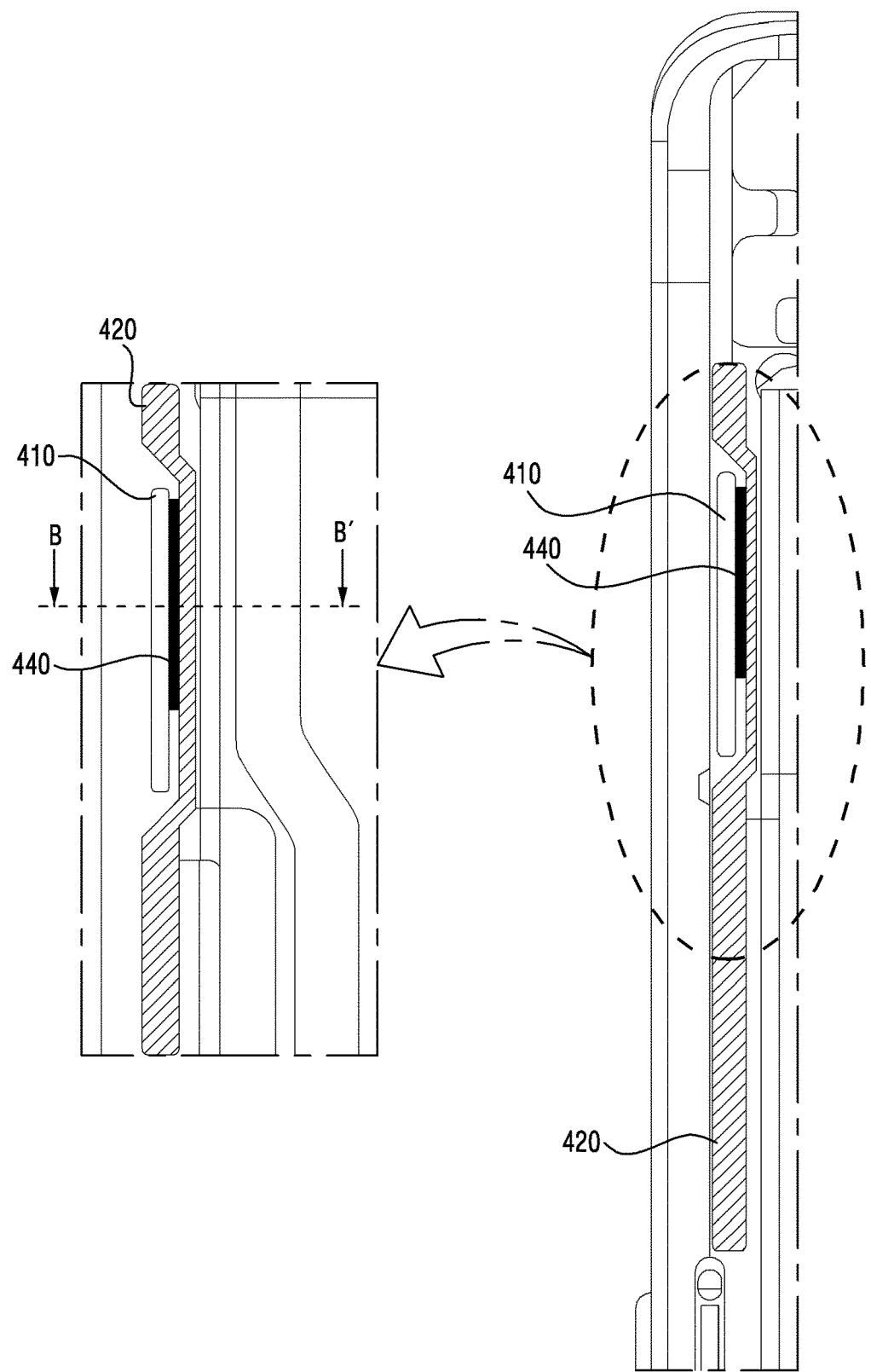
FIG. 4A illustrates a heat emission structure of an electronic device according to an embodiment.
Figure 4B:
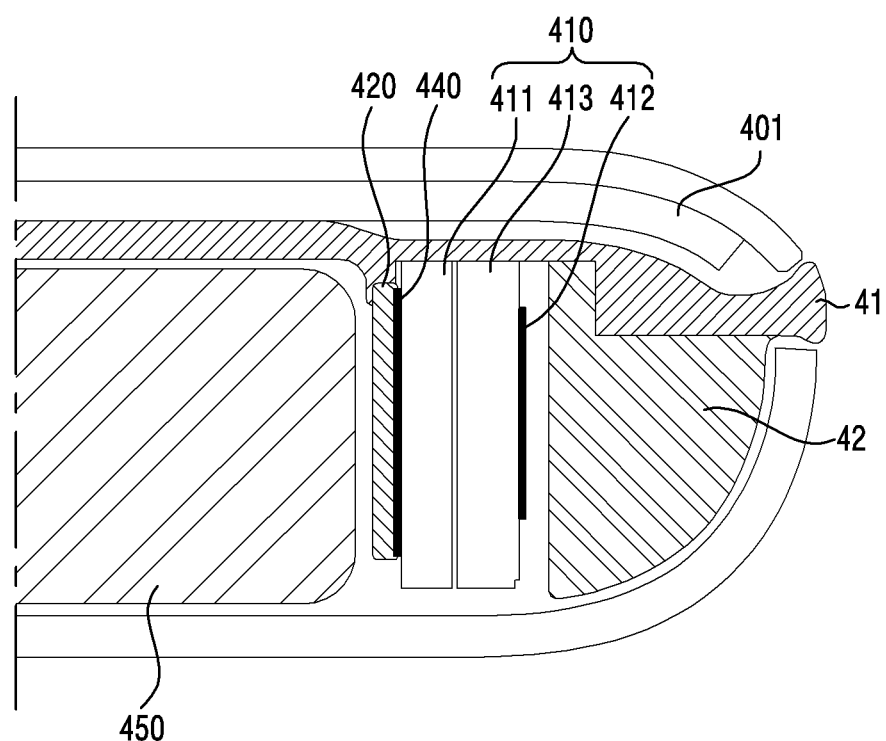
FIG. 4B is a cross section taken along line B-B' of FIG. 4A.
Figure 4C:
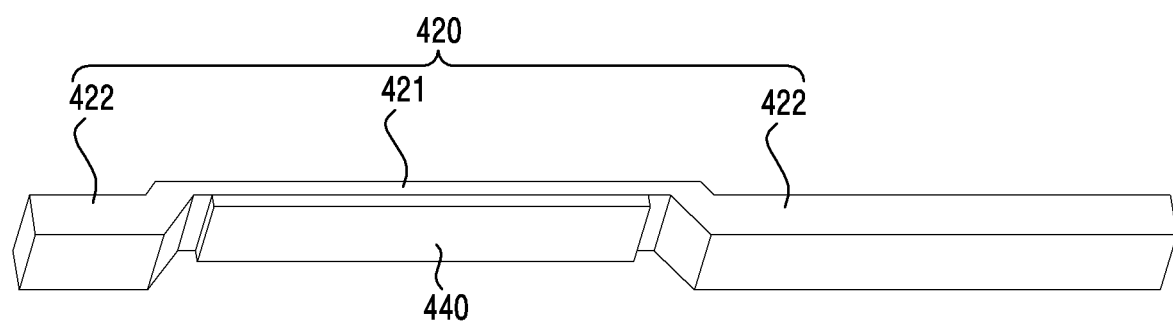
FIG. 4C illustrates a thermal diffusion member according to an embodiment.

FIG. 4A illustrates a heat emission structure of an electronic device according to an embodiment. FIG. 4B is a cross section taken along line B-B' of FIG. 4A. FIG. 4C illustrates a thermal diffusion member according to an embodiment.

Referring to FIG. 4A to FIG. 4C, the electronic device may include a display 401, a bracket 41, a side housing 42, an antenna module 410, a heat pipe 420, thermal interfacing materials 440, and a battery 450. The display 401, the bracket 41, the side housing 42, the antenna module 410 including a communication module 411, an antenna pattern 412 and a substrate 413, the thermal interfacing materials 440, and the battery 450 of FIG. 4A to FIG. 4C are similar to the display 301, the bracket 31, the side housing 32, the antenna module 310, the thermal interfacing materials 340, and the battery 350 of FIG. 3A to FIG. 3D. Thus, a detailed description thereof is omitted.

The heat pipe 420 may include a first portion 421 and at least one second portion 422. The first portion 421 thermally contacts the antenna module 410 through the thermal interfacing materials 440. The at least one second portion 422 has a height difference with the first portion 421 and is extended in parallel with the first portion 421. The first portion 421 may have a thinner thickness (e.g., a length of a horizontal direction) than the second portion 422, which minimizes a mounting space of a transverse direction (e.g., an X-axis direction of FIG. 2A). The thickness of the second portion 422 may be similar with the thickness of the antenna module 410.

The first portion 421 may not have a structure (e.g., wick structure) for thermal diffusion or may have a smaller structure than the second portion 422. The first portion 421 may have a specific strength enabling it to support the antenna module 410.

A part (e.g., the first portion 421) of the heat pipe 420 may have a role/function of the conductor plate 320 of FIG. 3A to FIG. 3D.

In the above-described heat emission structure, heat provided by the communication module 411 may be transferred to the first portion 421 of the heat pipe 420 through the heat interfacing materials 440, and the heat transferred to the first portion 421 may be moved and/or diffused to a low-temperature region through the second portion 422 of the heat pipe 420.

Figure 5A:
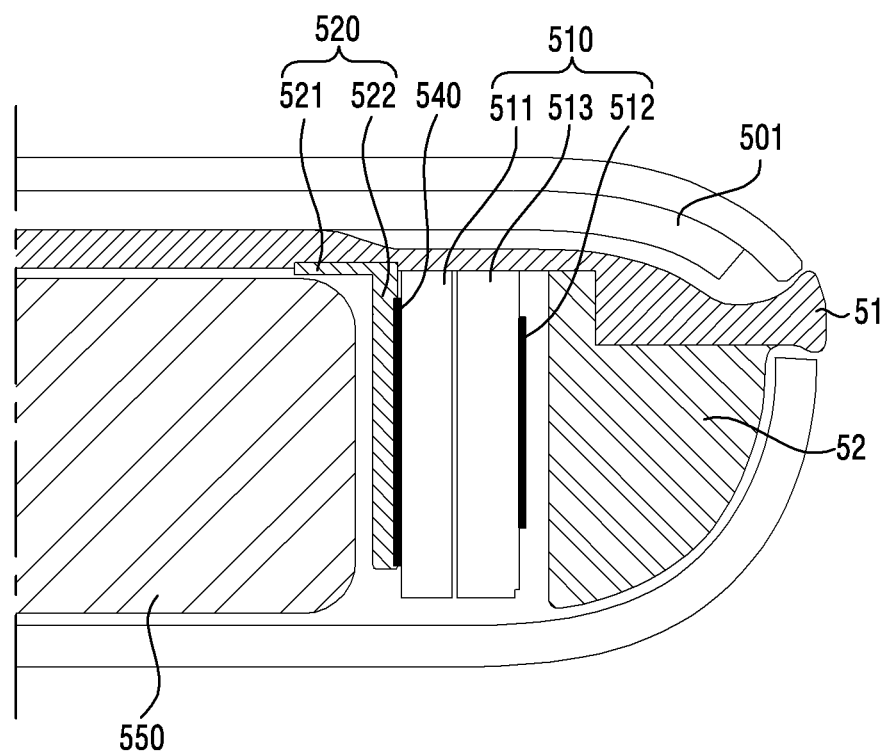
FIG. 5A illustrates a heat emission structure of an electronic device according to an embodiment.
Figure 5B:
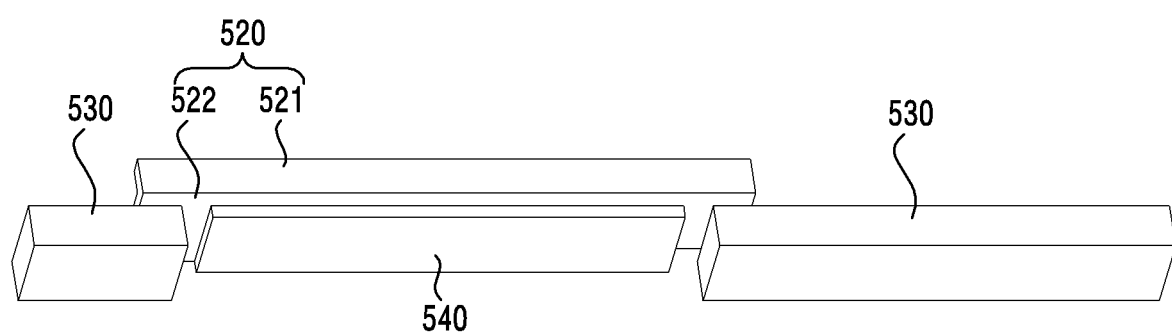
FIG. 5B illustrates a thermal diffusion member according to an embodiment.

FIG. 5A illustrates a heat emission structure of an electronic device according to an embodiment. FIG. 5B illustrates a thermal diffusion member according to an embodiment.

Referring to FIG. 5A and FIG. 5B, the electronic device (e.g., the electronic device 101 or the electronic device 200) of an embodiment of the disclosure may include a display 501, a bracket 51, a side housing 52, an antenna module 510, a conductor plate 520, a heat pipe 530, thermal interfacing materials 540, and a battery 550. The display 501, the bracket 51, the side housing 52, the antenna module 510 including a communication module 511, an antenna pattern 512 and a substrate 513, the heat pipe 530, the thermal interfacing materials 540, and the battery 550 of FIG. 5A and FIG. 5B are similar with the display 301, the bracket 31, the side housing 32, the antenna module 310, the heat pipe 330, the thermal interfacing materials 340, and the battery 350 of above-described FIG. 3A to FIG. 3D and thus, a detailed description thereof is omitted.

The conductor plate 520 may have a ']' shape and may include a contact surface 522 and a support surface 521. The contact surface 522 contacts the communication module 511 of the antenna module 510 through the thermal interfacing materials 540. The support surface 521 is extended vertically to the contact surface 522 and supports the contact surface 522. For example, the support surface 521 may be coupled to the bracket 51, thereby more stably supporting the antenna module 510.

The support surface 521 may be positioned at a lower end of the display 501, and may contact another thermal diffusion member (e.g., a vapor chamber) diffusing heat of the display 501.

In the above-described heat emission structure, heat provided by the communication module 511 may be transferred to the contact surface 522 of the conductor plate 520 via the thermal interfacing materials 540, and may be moved/diffused to a low-temperature region via the heat pipe 530 connected to the contact surface 522. The heat transferred to the contact surface 522 may be moved/diffused to the low-temperature region, by means of the bracket 51 connected with the support surface 521, and/or another thermal diffusion member.

Figure 6:
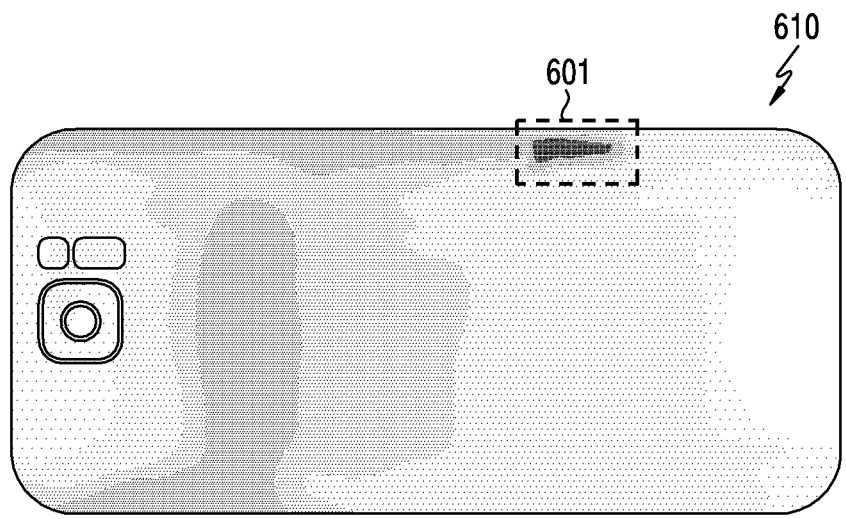
FIG. 6 illustrates a result of measuring heat emission of an electronic device according to an embodiment.
Figure 6:
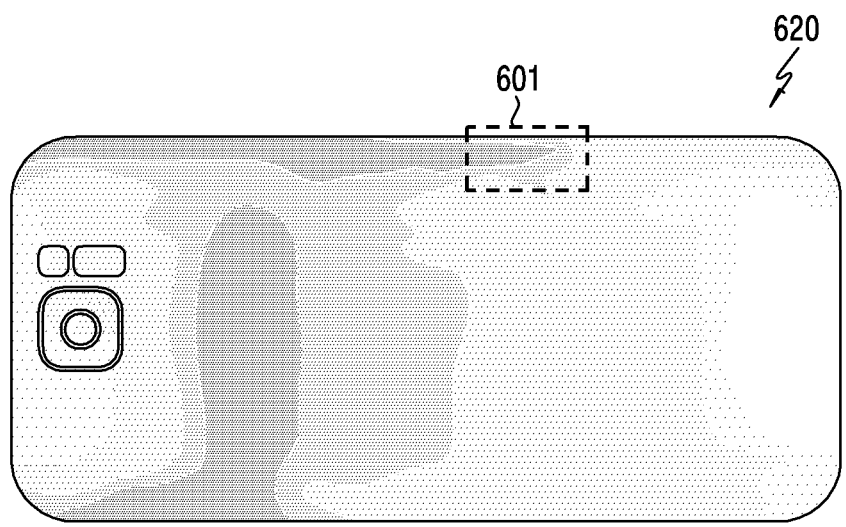

FIG. 6 illustrates a result of measuring heat emission of an electronic device according to an embodiment.

Referring to FIG. 6, when the electronic device (e.g., the electronic device 101 or the electronic device 200) of various embodiments of the disclosure does not have the heat emission structure, as illustrated in reference numeral 610, a region 601 where an antenna module (e.g., the antenna module 310, the antenna module 410, or the antenna module 510) is positioned may have a relatively higher temperature (e.g., 39.5 degrees) than the surroundings since the antenna module consumes high current during high-speed communication, and the consumed current is converted into heat.

In the electronic device applying the heat emission structure of the present disclosure, as illustrated in reference numeral 620, a region 601 where the antenna module is positioned may have a similar temperature (e.g., 36.7 degrees) with the surroundings, since heat provided by the antenna module has been diffused to the surroundings by the heat emission structure.

An electronic device (e.g., the electronic device (101), the electronic device (200)) as described above includes a housing including a first surface (e.g., the front surface (2001)), a second surface (e.g., the rear surface (2002)) facing the first surface, and a third surface (e.g., the left side surface (221), the right side surface (222), the upper side surface (223), the lower side surface (224)) vertical to the first surface and the second surface; a display (e.g., the display device (160), the display (201), the display (301), the display (401), the display (501)) exposed through at least part of the first surface; a battery (e.g., the battery (189), the battery (350), the battery (450), the battery (550)) arranged between the first surface and the second surface, a heating source arranged between the battery and the third surface in a direction vertical to the first surface and the second surface, and a thermal diffusion member arranged vertically to the first surface and the second surface, and having one portion being thermally contacted with at least part of the heating source and diffusing heat provided by the heating source to other portion.

The heating source may comprise an antenna module (e.g., the antenna module (310), the antenna module (410), the antenna module (510)) configured to communicate at a frequency band of 20 GHz or more.

The antenna module may comprise: a substrate (e.g., the substrate (313), the substrate (413), the substrate (513)) arranged in a vertical direction; a communication module (e.g., the communication module (311), the communication module (411), the communication module (511)) mounted in an inner side surface of the substrate, and an antenna pattern (e.g., the antenna pattern (312), the antenna pattern (412), the antenna pattern (512)) mounted in an outer side surface of the substrate.

The thermal diffusion member may include a conductor plate (e.g., the conductor plate (320), the conductor plate (520)) collecting heat of the heating source, thermal interfacing materials (e.g., the first thermal interfacing materials (340), the thermal interfacing materials (540)) arranged between the conductor plate and the heating source, and at least one heat pipe (e.g., the heat pipe (330), the heat pipe (530)) contacting or welded to the conductor plate.

The conductor plate may include a contact surface (e.g., the contact surface (522)) contacting the heating source, and a support surface (e.g., the support surface (521)) extended vertically to the contact surface and supporting the contact surface.

The support surface may contact another thermal diffusion member diffusing heat provided by the display.

The thermal diffusion member may include a heat pipe (e.g., the heat pipe (420)) and thermal interfacing materials (e.g., the thermal interfacing materials (440)) arranged between the heat pipe and the heating source. The heat pipe may include a first portion (e.g., the first portion (421)) thermally contacting with the heating source through the thermal interfacing materials, and at least one second portion (e.g., the second portion (422)) having a height difference with the first portion, and extended in parallel with the first portion.

A horizontal length (e.g., thickness) of the first portion may be less (e.g., thinner) than a horizontal length of the second portion.

The electronic device may further comprise a metal bracket (e.g., the bracket (31), the bracket (41), the bracket (51)) supporting the display.

The thermal diffusion member may contact the metal bracket.

An electronic device (e.g., the electronic device (101), the electronic device (200)) as described above includes a housing, a display (e.g., the display device (160), the display (201), the display (301), the display (401), the display (501)) exposed through at least part of a front surface of the housing, a battery (e.g., the battery (189), the battery (350), the battery (450), the battery (550)) arranged within the housing, an antenna module (e.g., the antenna module (310), the antenna module (410), the antenna module (510)) arranged vertically to the display between the battery and a side surface of the housing, and supporting communication at a frequency band of 20 GHz or more; a conductor plate (e.g., the conductor plate (320), the conductor plate (520)) thermally contacting at its one end with at least part of an inner side surface of the antenna module, and a heat pipe (e.g., the heat pipe (330), the heat pipe (530)) contacting at its one end with the conductor plate, and arranged vertically to the display.

The antenna module may include a substrate (e.g., the substrate (313), the substrate (413) arranged in a vertical direction, a communication module (e.g., the communication module (311), the communication module (411), the communication module (511)) mounted in an inner side surface of the substrate, and an antenna pattern (e.g., the antenna pattern (312), the antenna pattern (412), the antenna pattern (512)) mounted in an outer side surface of the substrate.

The electronic device may further include first thermal interfacing materials (e.g., the thermal interfacing materials (340), the thermal interfacing materials (540)) arranged between the communication module and the conductor plate, and second thermal interfacing materials arranged between the conductor plate and the heat pipe.

The conductor plate may comprise: a contact surface (e.g., the contact surface (522)) contacting the antenna module, and a support surface (e.g., the support surface (521)) extended vertically to the contact surface and supporting the contact surface.

The support surface may contact another thermal diffusion member diffusing heat provided by the display.

The electronic device may further include a bracket (e.g., the bracket (31), the bracket (41), the bracket (51)) of metal materials supporting the display.

The heat pipe may contact at its one portion with the bracket of metal materials.

An electronic device (e.g., the electronic device (101), the electronic device (200)) as described above includes a housing; a display (e.g., the display device (160), the display (201), the display (301), the display (401), the display (501)) exposed through at least part of a front surface of the housing, a battery (e.g., the battery (189), the battery (350), the battery (450), the battery (550)) arranged within the housing, an antenna module (e.g., the antenna module (310), the antenna module (410), the antenna module (510)) arranged vertically to the display between the battery and a side surface of the housing, and supporting communication at a frequency band of 20 GHz or more, and a heat pipe (e.g., the heat pipe (420)) thermally contacting at one portion with at least part of an inner side surface of the antenna module, and arranged vertically to the display.

The heat pipe may include a first portion (e.g., the first portion (421)) thermally contacting with the antenna module through the thermal interfacing materials, and at least one second portion (e.g., the second portion (422)) having a height difference with the first portion, and extended in parallel with the first portion.

A horizontal length of the first portion may be less than a horizontal length of the second portion.

By minimizing a mounting space of a heat emission component, the electronic device of the present disclosure cures a limit in structure change, battery size decrease, and terminal size increase of the electronic device. Also, the present disclosure may effectively diffuse heat provided by the antenna module and thus, may provide stable high-speed data communication. For example, embodiments of the disclosure may decrease a frequency in which, due to a high temperature, high-speed data communication is limited by a communication module or an AP.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms such as "logic," "logic block," "part," or "circuitry". A module may be a single integral component, or a minimum unit or part thereof, adapted to perform one or more functions. For example, the module may be implemented in a form of an application-specific integrated circuit (ASIC).

Embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute the instructions, with or without using one or more other components under the control of the processor. This allows the machine to be operated to perform at least one function according to the at least one invoked instruction. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to embodiments of the disclosure may be included and provided in a computer program product that may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be performed sequentially, in parallel, repeatedly, or heuristically, or one or more of the operations may be executed in a different order or omitted, or one or more other operations may be added.

What is claimed is:

1. An electronic device comprising:
a housing comprising a first surface, a second surface facing the first surface, and a third surface substantially perpendicular to the first surface and the second surface;
a display exposed through at least part of the first surface;
a battery arranged between the first surface and the second surface;
a heating source arranged between the battery and the third surface, wherein the heating source extends in a direction substantially perpendicular to the first surface and the second surface;
a first thermal diffusion member arranged substantially perpendicular to the first surface and the second surface,
wherein the first thermal diffusion member includes:
a conductor plate collecting heat of at least part of the heating source,
at least one thermal interfacing material, adjacent to a center of the conductor plate, arranged between a first surface of the conductor plate and the heating source, and
at least one heat pipe thermally coupled to the first surface of the conductor plate,
wherein the conductor plate diffuses heat provided by the heating source to the at least one heat pipe,
wherein the heating source comprises an antenna module, and
wherein the antenna module comprises:
a substrate;
a communication module mounted in an inner side surface of the substrate; and
an antenna pattern mounted in an outer side surface of the substrate.

2. The electronic device of claim 1,
wherein the antenna module configured to communicate at a frequency band of at least 20 gigahertz (GHz).

3. The electronic device of claim 1, wherein the conductor plate of the first thermal diffusion member comprises:
a contact surface contacting the heating source; and
a support surface extended substantially perpendicular to the contact surface and supporting the contact surface.

4. The electronic device of claim 3,
wherein the support surface contacts a second thermal diffusion member diffusing heat provided by the display.

5. The electronic device of claim 1, further comprising a metal bracket supporting the display.

6. The electronic device of claim 5,
wherein the first thermal diffusion member contacts the metal bracket.

* * * * *